(12) United States Patent
Gereige et al.

(10) Patent No.: US 12,323,099 B2
(45) Date of Patent: Jun. 3, 2025

(54) POLYMER BASED PHOTOVOLTAIC MODULES WITH EMBEDDED OPTICAL SENSORS

(71) Applicant: Saudi Arabian Oil Company, Dhahran (SA)

(72) Inventors: Issam Gereige, Thuwal (SA); Anas Bintin, Thuwal (SA); Konstantinos Kotsovos, Thuwal (SA)

(73) Assignee: Saudi Arabian Oil Company, Dhahran (SA)

( * ) Notice: Subject to any disclaimer, the term of this patent is extended or adjusted under 35 U.S.C. 154(b) by 222 days.

(21) Appl. No.: 18/181,908

(22) Filed: Mar. 10, 2023

(65) Prior Publication Data
US 2024/0297619 A1 Sep. 5, 2024

(30) Foreign Application Priority Data
Mar. 3, 2023 (GR) ............... 20230100186

(51) Int. Cl.
| | |
|---|---|
| *H02S 50/00* | (2014.01) |
| *G01N 21/59* | (2006.01) |
| *G01N 25/56* | (2006.01) |
| *H02S 40/30* | (2014.01) |
| *H02S 50/15* | (2014.01) |
| *H10F 19/80* | (2025.01) |

(52) U.S. Cl.
CPC ............ *H02S 50/00* (2013.01); *G01N 21/59* (2013.01); *G01N 25/56* (2013.01); *H02S 40/30* (2014.12); *H02S 50/15* (2014.12); *H10F 19/804* (2025.01)

(58) Field of Classification Search
CPC .......... H02S 50/00; H02S 50/10; H02S 50/15; H02S 40/30; G01N 21/59; H01L 31/048; H01L 31/0481; H01L 33/56
See application file for complete search history.

(56) References Cited

U.S. PATENT DOCUMENTS

| | | |
|---|---|---|
| 9,936,574 B2 | 4/2018 | Rogers et al. |
| 10,389,300 B2 | 8/2019 | Ko et al. |
| 2009/0014057 A1 | 1/2009 | Croft et al. |

(Continued)

FOREIGN PATENT DOCUMENTS

| | | |
|---|---|---|
| CN | 104849240 | 8/2015 |
| CN | 204964386 | 1/2016 |

(Continued)

OTHER PUBLICATIONS

Miluski, P., Kochanowicz, M., Zmojda, J., Silva, A.P., Reis, P.N.B., Ragin, T. and Dorosz, D.. "UV sensing optode for composite materials environment monitoring" Science and Engineering of Composite Materials, vol. 26, No. 1, 2019, pp. 240-243. https://doi.org/10.1515/secm-2019-0008 (Year: 2019).*

(Continued)

*Primary Examiner* — Kara E. Geisel
*Assistant Examiner* — Jonathon Cook
(74) *Attorney, Agent, or Firm* — Fish & Richardson P.C.

(57) ABSTRACT

The disclosure provides systems and methods to monitor the degradation of polymer layers in polymer based photovoltaic modules using an optical sensor. The optical sensor is embedded in a polymer layer of the polymer based photovoltaic module.

7 Claims, 12 Drawing Sheets

(56) References Cited

U.S. PATENT DOCUMENTS

| | | | |
|---|---|---|---|
| 2010/0283069 A1* | 11/2010 | Rogers | H01L 31/0725 |
| | | | 257/E31.127 |
| 2011/0273020 A1 | 11/2011 | Balachandreswaran et al. | |
| 2018/0053862 A1* | 2/2018 | Holman | H01L 31/1876 |
| 2019/0376847 A1* | 12/2019 | Bora | G01J 3/42 |
| 2020/0161291 A1 | 5/2020 | Rogers et al. | |
| 2023/0194361 A1* | 6/2023 | Nivelle | G01D 5/35316 |
| | | | 385/12 |

FOREIGN PATENT DOCUMENTS

| | | |
|---|---|---|
| CN | 205067342 | 3/2016 |
| CN | 105510795 | 4/2016 |
| CN | 207766215 | 8/2018 |
| CN | 110365292 | 10/2019 |
| CN | 114389531 | 4/2022 |
| DE | 102015005408 | 11/2016 |
| EP | 3885860 | 9/2021 |
| TW | 201205836 | 2/2012 |
| WO | WO 2022113101 | 6/2022 |

OTHER PUBLICATIONS

Li, Xiaochun, Thesis (PhD). Stanford University, Source DAI-B 62/10, p. 4745, Apr. 2002, 137 pages. https://ui.adsabs.harvard.edu/abs/2001PhDT.......60L (Year: 2001).*

Van Franeker JJ and Janssen RAJ (2015) Plastic Solar Cells: Understanding the Special Additive. Front. Young Minds. 3:9. doi: 10.3389/frym.2015.00009 (Year: 2015).*

Abaroa-Pérez B, Ortiz-Montosa S, Hernandez-Brito JJ, Vega-Moreno D. Yellowing, Weathering and Degradation of Marine Pellets and Their Influence on the Adsorption of Chemical Pollutants. Polymers (Basel). Mar. 24, 2022;14(7):1305. doi: 10.3390/polym14071305. PMID: 35406179; PMCID: PMC9003515. (Year: 2022).*

Bienert et al., "Silicon Solar Cell Integrated Stress and Temperature Sensors for Photovoltaic Modules," Progress in Photovoltaics, Feb. 2020, 28(7):717-24, 8 pages.

Patel et al., Design and Development of Solar Cell Integrated Moisture and Temperature Sensors for Photovoltaic Modules, presented at the 38th Annual European PV Solar Energy Conference and Exhibition, held virtually, Sep. 6-10, 2021, 5 pages.

* cited by examiner

POLYMER BASED PHOTOVOLTAIC MODULES WITH EMBEDDED OPTICAL SENSORS

FIELD

The disclosure provides systems and methods to monitor the degradation of polymer layers in polymer based photovoltaic modules using an optical sensor. The optical sensor is embedded in a polymer layer of the polymer based photovoltaic module.

BACKGROUND

Polymer layers in polymer based photovoltaic modules can undergo degradation, which results in a decrease in light transmitted to the photovoltaic cells. Covalent bonds in the polymer chains can absorb ultra-violet (UV) light and undergo chain succession reactions which embrittle and/or yellow the polymers.

SUMMARY

The disclosure provides systems and methods to monitor the degradation of polymer layers in polymer based photovoltaic modules using an optical sensor. The optical sensor is embedded in a polymer layer of the polymer based photovoltaic module.

The systems and methods can detect a reduction in the transparency due to polymer degradation caused, for example, by UV radiation and/or heat from sunlight exposure and/or quantify optical losses. The systems and methods can also estimate a corresponding reduction in the performance of the photovoltaic module.

The systems and methods can reduce the frequency of inspection, detect faults, predict the durability, assist in preventative and predictive maintenance, assess performance, and/or assist in the allocation of resources to reduce operating and/or maintenance costs associated with polymer based photovoltaic modules.

The polymer based photovoltaic modules of the disclosure can have a reduced weight, be relatively easily transported, be relatively easily installed, and/or can have improved mechanical stability compared to certain other photovoltaic modules, such as glass based photovoltaic modules.

The optical sensors can allow the transmittance to be monitored in real time. The optical sensors can be incorporated into a polymer layer relatively easily compared, for example, to certain glass based photovoltaic modules. In some embodiments, to reduce costs, only a portion (e.g., only one) photovoltaic module in a string of photovoltaic modules includes the optical sensor.

In a first aspect, the disclosure provides a photovoltaic module, including a photovoltaic cell including first, second and third polymer layers, the first polymer layer being between the second and third polymer layers, and a first optical sensor disposed in the first polymer layer at a first position.

In some embodiments, the first optical sensor further includes an antenna configured to transmit data measured by the first optical sensor.

In some embodiments, the photovoltaic module further includes a data acquisition system including a receiver configured to receive data transmitted by the antenna.

In some embodiments, the photovoltaic cell includes a material capable of converting sunlight into electricity.

In some embodiments, the first polymer layer has a thickness of 0.2 mm to 1 mm.

In some embodiments, the photovoltaic module further includes a second optical sensor disposed in the first polymer layer at a second position different from the first position.

In some embodiments, the photovoltaic module further includes a moisture sensor disposed in the first polymer layer at a second position different from the first position.

In some embodiments, the photovoltaic module further includes a temperature sensor disposed in the second polymer layer.

In some embodiments, the second polymer layer has a thickness of 0.2 mm to 1 mm.

In some embodiments, the photovoltaic module further includes a fuse box. The photovoltaic cell is between the first polymer layer and the second polymer layer, and the fuse box is below the second polymer layer.

In a second aspect, the disclosure provides a system including, a plurality of photovoltaic modules. The plurality of photovoltaic modules are configured to convert sunlight into electricity, and one or more of the plurality of photovoltaic modules include a photovoltaic module of the disclosure.

In a third aspect, the disclosure provides a method, including measuring a transmittance of light in a first polymer layer of a photovoltaic module using a first optical sensor disposed in the first polymer layer at a first position. The first polymer layer is between second and third polymer layers of the photovoltaic module.

In certain embodiments, the method further includes, after measuring the transmittance of light in the first polymer layer, wirelessly transmitting data to a data acquisition system. The data includes information about the transmittance of light in the first polymer layer measured using the first optical sensor.

In certain embodiments, the method further includes, before measuring the transmittance of light in the first polymer layer, exposing the first polymer layer to ultraviolet light.

In certain embodiments, the method further includes, after measuring the transmittance of light in the first polymer layer, calculating a change in transmittance relative to a transmittance of the first polymer layer prior to ultraviolet light exposure.

In certain embodiments, the method further includes, after measuring the transmittance of light in the first polymer layer, calculating a yellowing index.

In certain embodiments, the method further includes supplying power to the first optical sensor using the photovoltaic module.

In certain embodiments, the method further includes measuring the transmittance of light in the first polymer layer using a second optical sensor disposed in the first polymer layer at a second position. The second position is different from the first position.

In certain embodiments, the method further includes measuring a moisture level in the photovoltaic module using a moisture sensor disposed in the first polymer layer.

In certain embodiments, the method further includes measuring a moisture level in the photovoltaic module using a temperature sensor disposed in the second polymer layer.

Any combinations of the various embodiments and implementations disclosed herein can be used in a further embodiment, consistent with the disclosure, and the claims may be recited to have (or amended to include), where appropriate, multiple dependency to express such combination of elements. Moreover, although certain features of embodiments or implementations disclosed herein may be described as being or acting in certain combinations, one or more features from such a combination can, in some cases, be excised from the combination, and the claimed combination may be directed to a sub-combination or variation of a sub-combination. These and other aspects and features can be appreciated from the following description of certain embodiments presented herein in accordance with the disclosure and the accompanying drawings and claims.

DETAILED DESCRIPTION

Figure 1A:
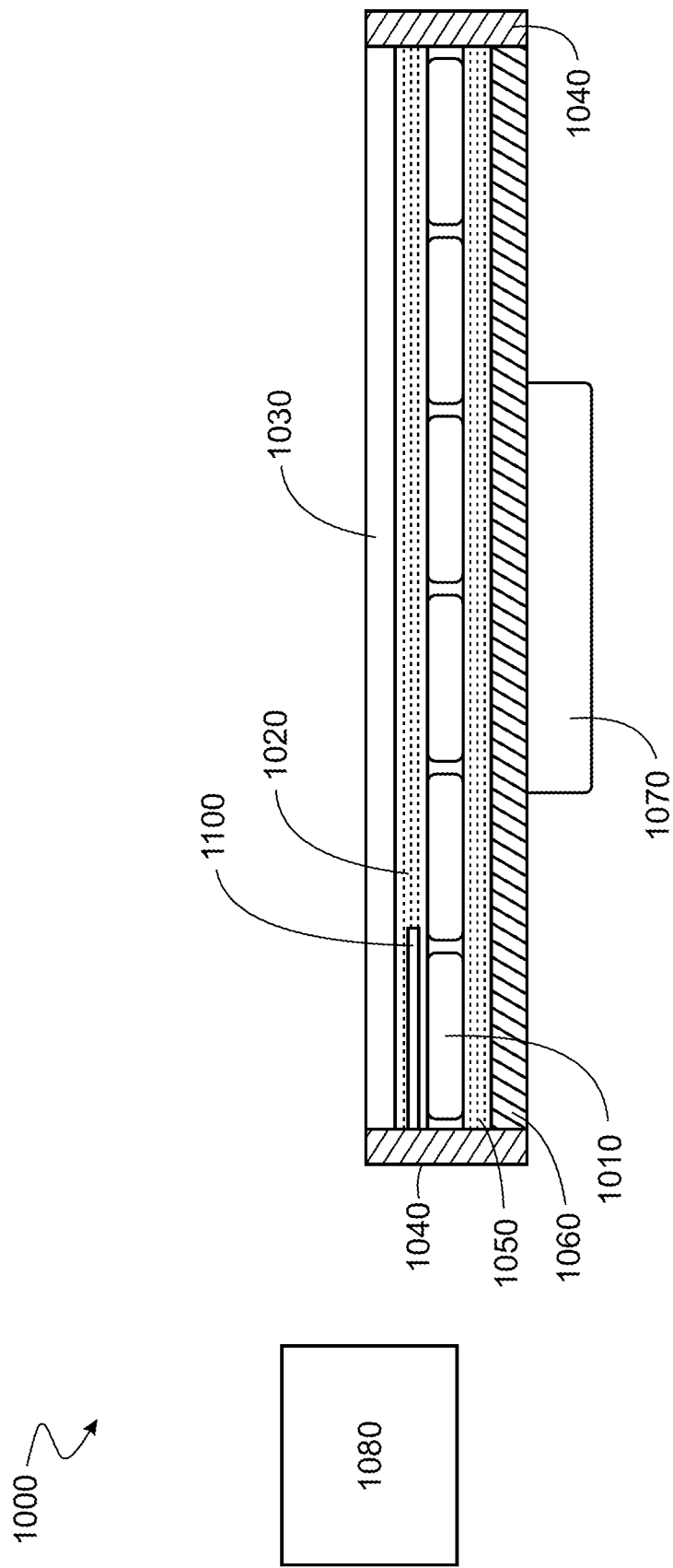
FIG. 1A depicts a schematic of a cross sectional side view of a polymer based photovoltaic module.
Figure 1B:
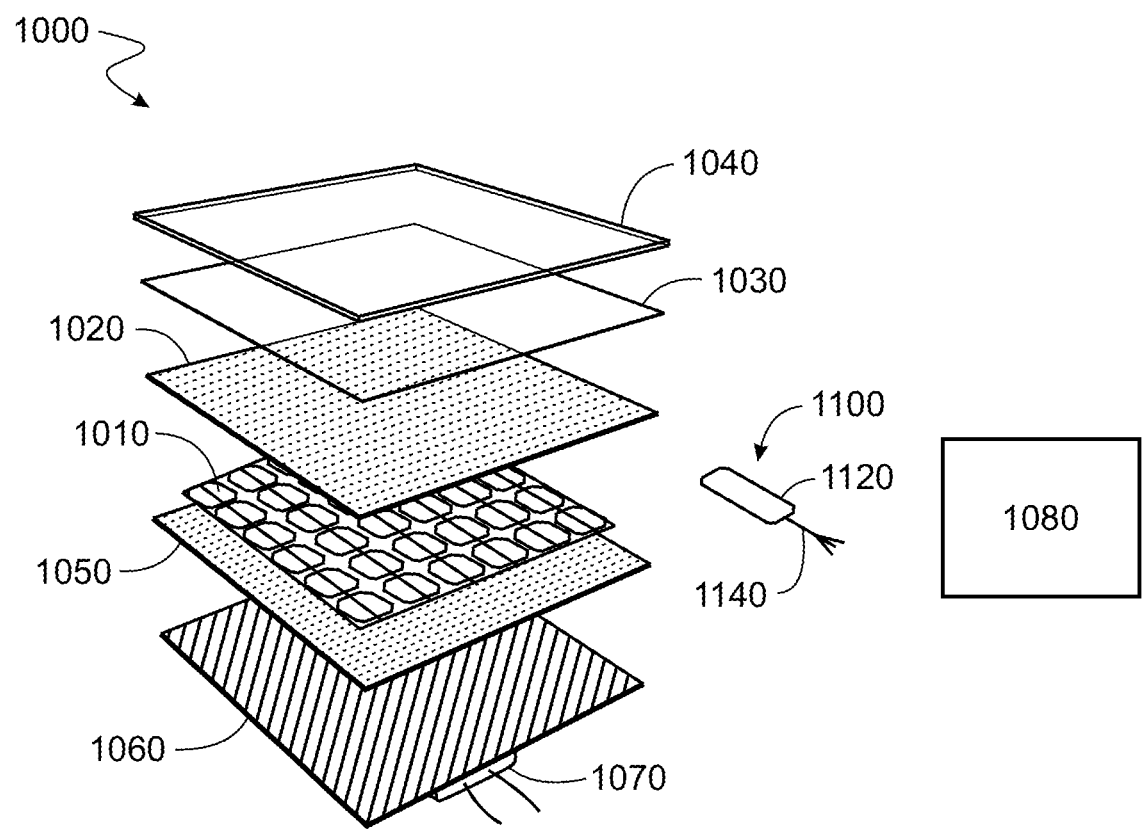
FIG. 1B depicts a schematic of an exploded view of the polymer based photovoltaic module according to FIG. 1A.

FIGS. 1A and 1B depict cross sectional side and exploded views, respectively, of a polymer based photovoltaic module 1000. The polymer based photovoltaic module 1000 includes photovoltaic cells 1010 to convert sunlight into electricity (e.g., polycrystalline silicon, monocrystalline silicon, PERC). A top face of the photovoltaic cells 1010 supports an encapsulant polymer layer 1020. The encapsulant polymer layer 1020 provides a flexible cushion for the photovoltaic cells 1010 and protection from the environment while permitting sufficient light transmission. Atop the encapsulant polymer layer is the top polymer layer 1030. The top polymer layer 1030 includes a harder polymer, such as polycarbonate, and provides protection to the polymer based photovoltaic module 1000. The polymer based photovoltaic module 1000 further includes a surrounding frame 1040.

A bottom face of the photovoltaic cells 1010 supports a bottom encapsulant polymer layer 1050. Similar to the encapsulant polymer layer 1020, the bottom encapsulant polymer layer 1050 provides a flexible cushion for the photovoltaic cells 1010 and protection from the environment while permitting sufficient light transmission. Upon curing, the encapsulant polymer layer 1020 and the bottom encapsulant polymer layer 1050 can coalesce into a single layer with the photovoltaic cells 1010 sandwiched in between. Below the bottom encapsulant layer is a back layer 1060. The back layer 1060 is a low weight material to provide protection and a seal for the bottom encapsulant polymer layer 1050. Below the back layer is a fuse box 1070. The fuse box 1070 houses the connections of the polymer based photovoltaic module 1000 and the fuse.

Embedded within the encapsulant polymer layer 1020 is an optical sensor 1100. The optical sensor 1100 includes a sensing element 1120 and an antenna 1140. The optical sensor 1100 is configured to measure a transmittance of the encapsulant polymer layer 1020, and/or the top polymer layer 1030. The optical sensor 1100 usually measures changes in voltage in response to light irradiation, which is then converted to transmittance. The optical sensor 1100 can measure a decrease in the transmittance of the encapsulant polymer layer 1020, and/or the top polymer layer 1030 due, for example, to degradation induced by UV light and/or heat. Without wishing to be bound by theory, it is believed that light transmittance can be correlated to polymer degradation. Additionally, in this configuration, the optical sensor 1100 is protected from environmental conditions. In general, the optical sensor 1100 should be compatible with the chemical adhesion mechanism of the encapsulant polymer layer 1020.

The optical sensor 1100 is configured to be powered by a portion of the electricity generated by the polymer based photovoltaic module 1000, for example, by connecting a power input of the optical sensor 1100 to a power output of the polymer based photovoltaic module 1000. In general, the optical sensor 1100 does not need to operate at night.

The antenna 1140 is configured to wirelessly transmit data collected by the optical sensor 1100 (e.g., analog data) to a receiver of a data acquisition system 1080 (e.g., a server, a computer, a control panel). Based on calibration of the optical sensor 1100, the status of the optical sensor 1100 and/or the accuracy of its measurements can be determined. The calibration can include upper and lower values, and if the optical sensor 1100 measures a value outside of this range, the optical sensor 1100 may be deemed faulty. The data acquisition system 1080 can allow for real time monitoring of the transmission.

Data from the optical sensor 1100 can be collected over time. A reference value for the optical sensor 1100 element is taken as a reference baseline value measured on the polymer based photovoltaic module 1000 at a factory setting (e.g., during assembly of the polymer based photovoltaic module 1000) and during operation the change in the measured metric will reflect performance reduction over time. In general, the optical sensor 1100 can be incorporated into the encapsulant polymer layer 1020 using any appropriate method. For example, the optical sensor 1100 can be incorporated using inkjet or other printing techniques, or can be infused within the encapsulant polymer layer 1020 during extrusion or injection molding of the encapsulant polymer layer.

In general, the optical sensor 1100 can be any appropriate optical sensor. Examples of the optical sensors 1100 include silicon based light sensors, silicon based photodetectors, and micro-electro-mechanical systems (MEMS) based sensors. The optical sensor 1100 should have relatively high sensitivity to UV and visible light (e.g., in the range of 300-800 nm). The transmission measurements from the optical sensor 1100 can be used to calculate a yellowness index of one or more components of the polymer based photovoltaic module 1000. The yellowness index can be calculated as:

$$YI = 100 * \frac{(a*X) - (b*Z)}{Y}$$

where a=1.301, b=1.149, X, Y, and Z are values of diffuse reflectance that are obtained using an optical sensor that differentiates the color values on the incident light. X can be calculated as $$X = \eta * \sum_{\lambda=380}^{\lambda=780} (S * P * \overline{x, y, z})$$

where η is the normalization factor, S is the reflectance value, P is the energy of the light spectrum, $\overline{x,y,z}$ are the standard observer functions that are recorded in a fact table. Without wishing to be bound by theory, it is believed that measuring the yellowness index can be used to monitor degradation in the polymers.

A difference in the yellowness index of the polymer based photovoltaic module 1000 can be computed based on the yellowness index prior to UV light exposure and after UV light exposure.

The optical sensor 1100 can be used to measure the light transmission of the polymer based photovoltaic module 1000.

The optical sensor 1100 can be used to calculate the short circuit current density and/or a change in the current density due to degradation of a polymer layer induced by UV light exposure. The short circuit current density ($J_{sc}$) can be correlated with transmittance losses due to polymer degradation through the spectral response curve of the device which depends on the solar cell material used in the PV module, and is defined by the following formula $$J_{sc} = \int S_r(\lambda) E_0(\lambda) d\lambda$$

where $S_r(\lambda)$ is the spectral response of the device, $E_0(\lambda)$ is the reference AM1.5 spectrum and λ the corresponding wavelength. For small values, the short circuit current density loss of a solar cell resulting from a change in transmitted light is roughly equivalent to the loss in current density of a solar cell resulting from the change in transmitted light as shown through the measurements in table 1.

The encapsulant polymer layer 1020, the top polymer layer 1030, the bottom encapsulant polymer layer 1050, and/or the back layer 1060 can be in the form of a sheet.

Examples of polymers for the encapsulant polymer layer 1020 and the bottom encapsulant polymer layer 1050 include ethylene vinyl acetate (EVA), polyolefins, and polyvinyl butyral (PVB). Examples of polymers for the top polymer layer 1030 include polycarbonate, poly(methyl methacrylate) (PMMA), and polytetrafluoroethylene (PETFE). Examples of polymers for the back layer 1060 include polyvinylidene fluoride (PVDF).

In some embodiments, the middle encapsulant layer 1020 has a thickness of 0.2 (e.g., at least 0.3, at least 0.4, at least 0.5, at least 0.6, at least 0.7, at least 0.8, at least 0.9) mm and/or at most 1 (e.g., at most 0.9, at most 0.8, at most 0.7, at most 0.6, at most 0.5, at most 0.4, at most 0.3) mm.

Figure 2A:
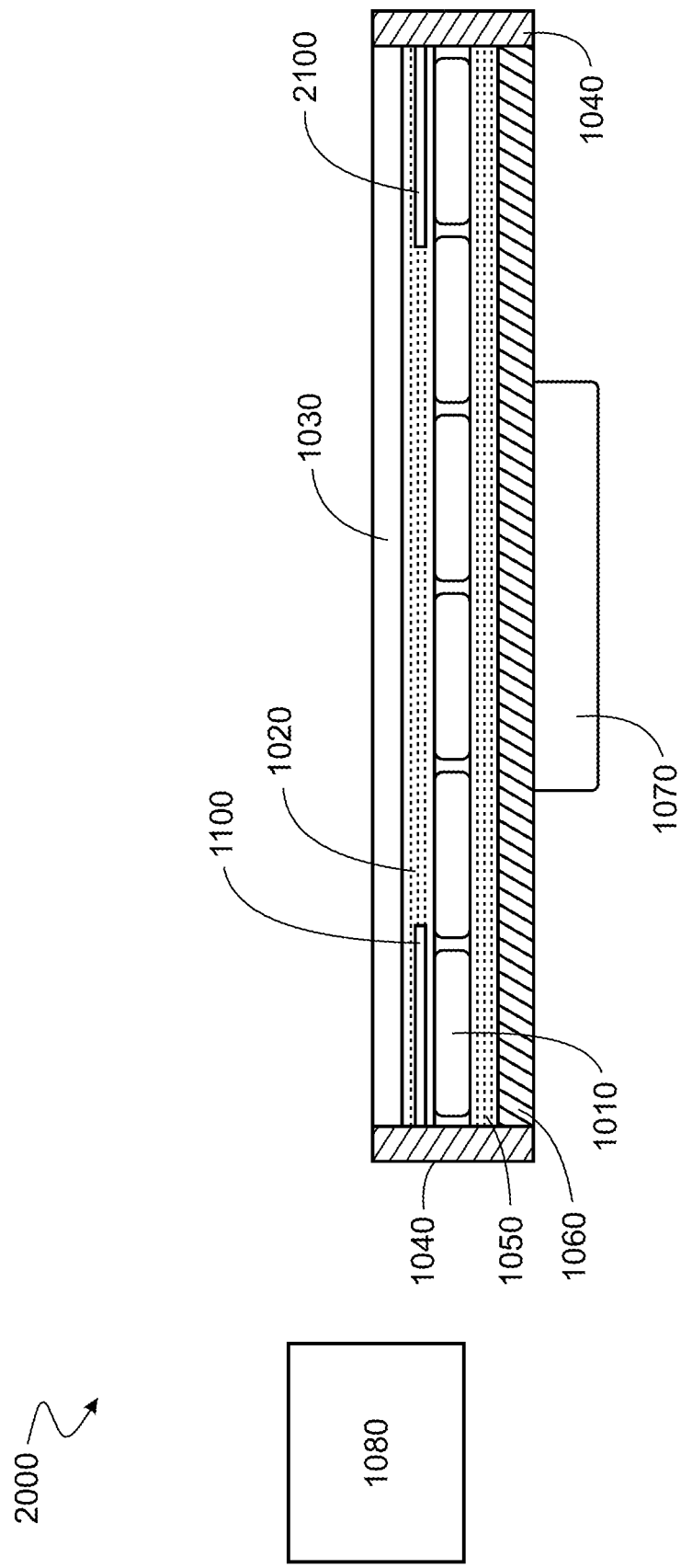
FIG. 2A depicts a schematic of a cross sectional side view of an alternative embodiment of a polymer based photovoltaic module.
Figure 2B:
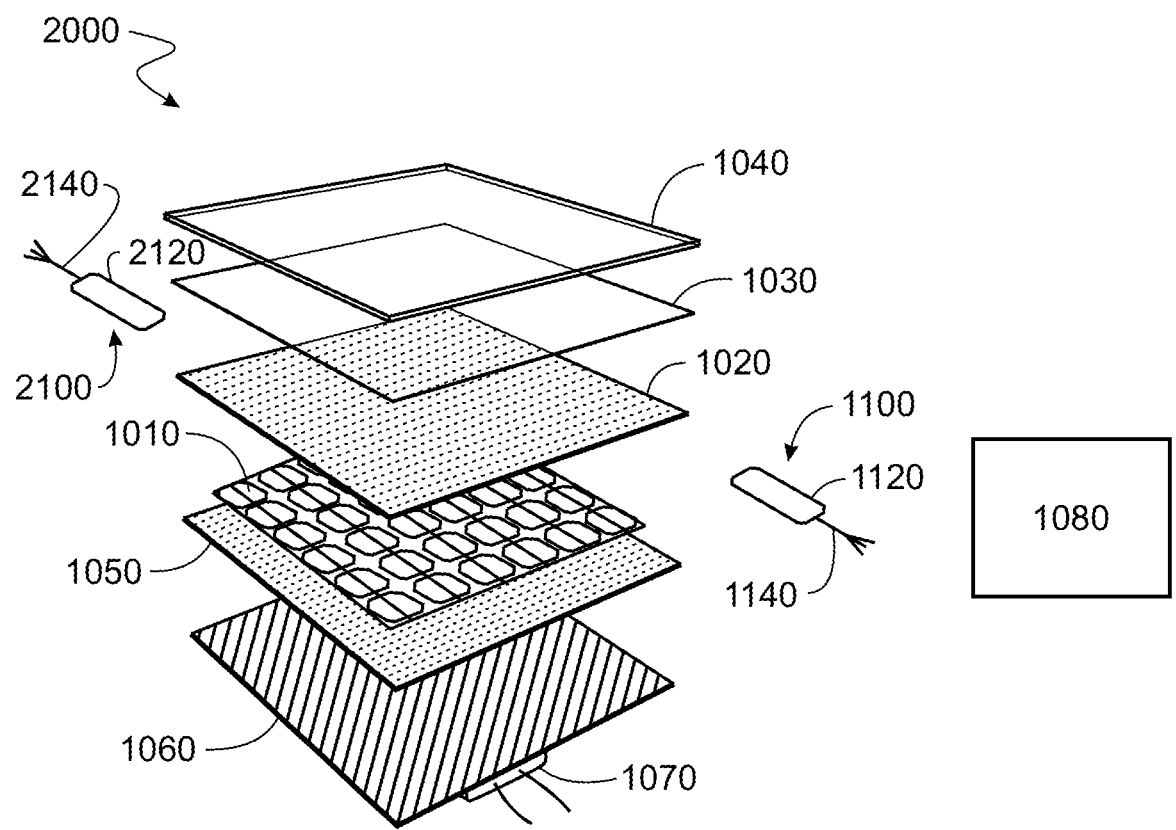
FIG. 2B depicts a schematic of an exploded view of the polymer based photovoltaic module according to FIG. 2A.

FIGS. 2A and 2B depict cross sectional side and exploded views, respectively, of a polymer based photovoltaic module 2000. The polymer based photovoltaic module 2000 includes the components of the polymer based photovoltaic module 1000, as well as the sensor 2100. The optical sensor 1100 is embedded in the encapsulant polymer layer 1020 at a first position and the sensor 2100 is embedded in the encapsulant polymer layer 1020 at a second position different from the first position. Like the optical sensor 1100, the sensor 2100 includes a sensing element 2120 and an antenna 2140.

In some embodiments, the sensor 2100 is an optical sensor. This allows the sensor 2100 to detect a decrease in the transmittance of the encapsulant polymer layer 1020, and/or the top polymer layer 1030 due to degradation induced by UV light at the second position. Thus, decreases in transmission can be detected at more than one position.

In certain embodiments, the sensor 2100 is a humidity sensor. The sensor 2100 can detect water vapor ingress, which indicates degradation of the polymer based photovoltaic module 2000. The humidity sensor can measure changes in resistivity. Without wishing to be bound by theory, it is believed that a humidity sensor with this placement can provide early tracking of the degradation of the polymer based photovoltaic module 2000 and detection of local environmental impacts that may accelerate degradation of the polymer based photovoltaic module 2000. Without wishing to be bound by theory, it is believed that the rate of water vapor ingress can increase over time. Using the sensor 2100 allows for the identification of degradation in different components of the polymer based photovoltaic module 2000 and/or degradation that may not immediately impact the performance of the polymer based photovoltaic module 2000.

In some embodiments, the sensor 2100 is a temperature sensor. Without wishing to be bound by theory, it is believed that a temperature sensor with this placement can detect hot spots and/or short circuits and can provide a relatively accurate measurement of the energy yield.

In certain embodiments, the sensor 2100 is a mechanical stress element that can monitor the mechanical degradation of the polymers.

Additional sensors can be embedded in the encapsulant polymer layer 1020 at additional positions to measure decreases in the transmittance and/or other parameters of interest (e.g., humidity, temperature) at those positions to detect degradation of a component of the polymer based photovoltaic module 2000. Generally, the number of sensors 2100 depends on the properties being measured. In certain embodiments, the polymer based photovoltaic module 2000 includes at least 2 (e.g., at least 3, at least 4, at least 5, at least 6, at least 10) sensors 2100 (e.g., optical sensors, humidity sensors, and/or temperature sensors) in the encapsulant polymer layer. The optical sensor 1100 and one or more sensors 2100 can be arranged in a periodic or random fashion.

Figure 3A:
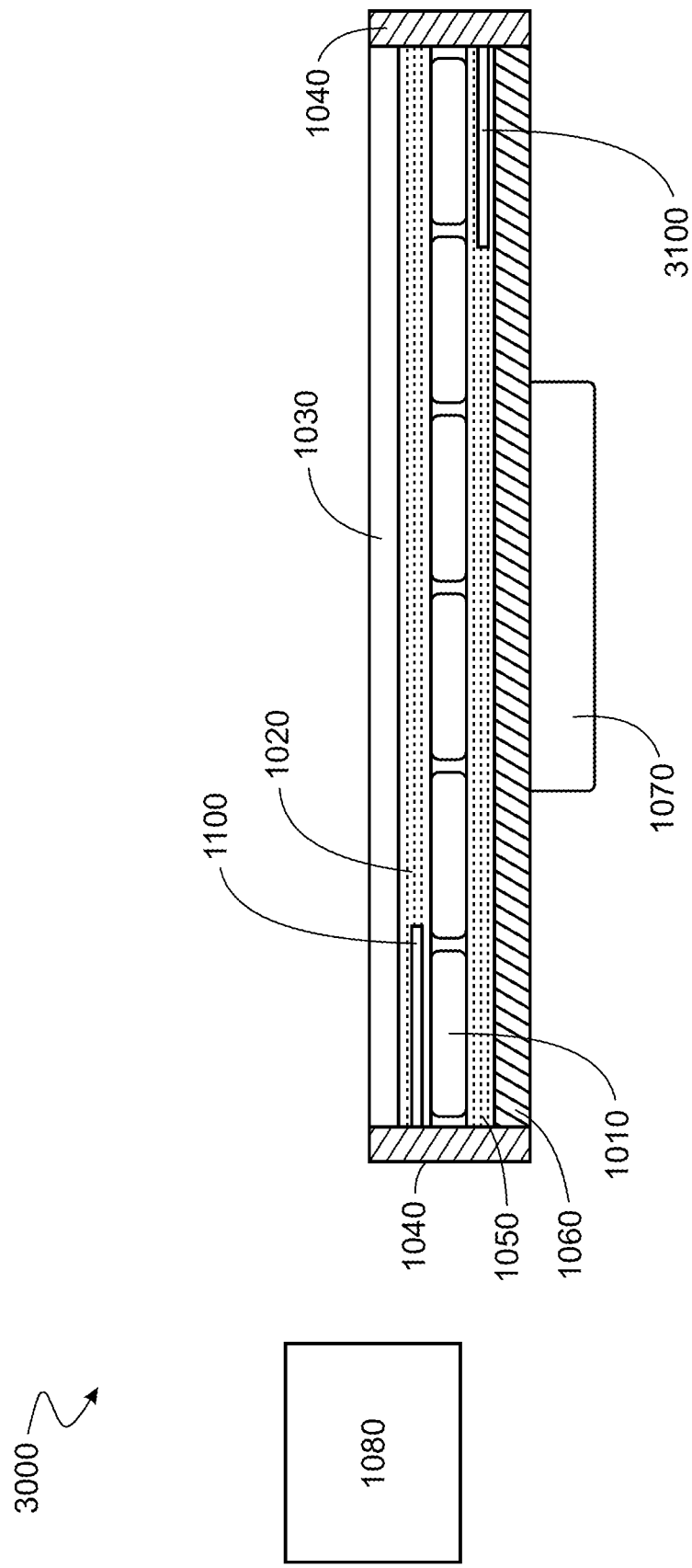
FIG. 3A depicts a schematic of a cross sectional side view of yet a further embodiment of a polymer based photovoltaic module.
Figure 3B:
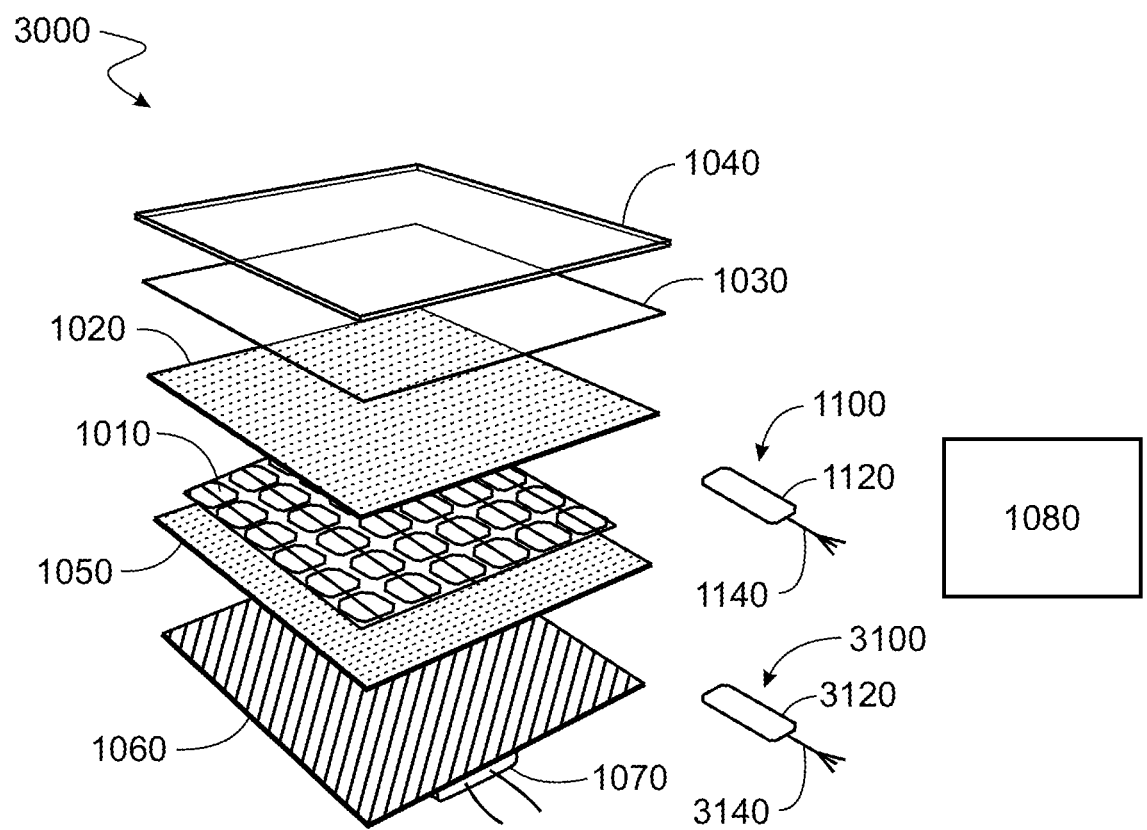
FIG. 3B depicts a schematic of an exploded view of the polymer based photovoltaic module according to FIG. 3A.

FIGS. 3A and 3B depict cross sectional side and exploded views, respectively, of a polymer based photovoltaic module 3000. The polymer based photovoltaic module 3000 includes the components of the polymer based photovoltaic module 1000, as well as the sensor 3100. The sensor 3100 is embedded in the bottom encapsulant polymer layer 1050. Like the optical sensor 1100, the sensor 3100 includes a sensing element 3120 and an antenna 3140.

In some embodiments, the sensor 3100 is a temperature sensor. Without wishing to be bound by theory, it is believed that a temperature sensor with this placement can provide a reference for measuring a temperature gradient on the polymer based photovoltaic module 3000 and/or be used for calculating thermal stresses.

In certain embodiments, the polymer based photovoltaic module 3000 includes at least 2 (e.g., at least 3, at least 4, at least 5, at least 6, at least 10) sensors 3100 (e.g., optical sensors, humidity sensors, and/or temperature sensors) in the bottom encapsulant polymer layer 1050. The optical sensor 1100 and one or more sensors 2100 can be arranged in a periodic or random fashion.

Additional sensors can be embedded in the encapsulant polymer layer 1020 and/or the bottom encapsulant polymer layer 1050 at additional positions to measure decreases in the transmittance and/or other parameters of interest (e.g., humidity, temperature) at those positions to detect degradation of a component of the polymer based photovoltaic module 3000.

In some embodiments, the bottom encapsulant layer 1050 has a thickness of at least 0.2 (e.g., at least 0.3, at least 0.4, at least 0.5, at least 0.6, at least 0.7, at least 0.8, at least 0.9) mm and/or at most 1 (e.g., at most 0.9, at most 0.8, at most 0.7, at most 0.6, at most 0.5, at most 0.4, at most 0.3) mm.

Figure 4:
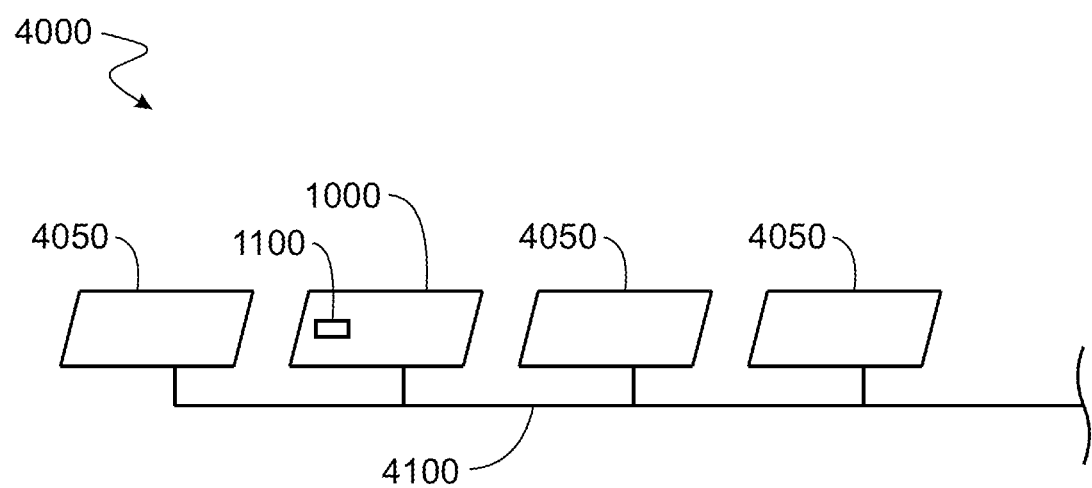
FIG. 4 depicts a schematic of a system.

FIG. 4 depicts a system 4000 that includes a polymer based photovoltaic module 1000 and a plurality of polymer based photovoltaic modules 4050. A wire 4100 removes electricity generated from the polymer based photovoltaic modules 1000 and 4050. The wire 4100 can, for example, deliver the electricity to a battery or an electrical grid. The polymer based photovoltaic module 1000 includes the optical sensor 1100. However, the polymer based photovoltaic modules 4050 do not include an optical sensor (e.g., the polymer based photovoltaic modules 4050 have the design of the polymer based photovoltaic module 1000 but without the optical sensor 1100). Without wishing to be bound by theory, the system 4000 allows the degradation of the polymer based photovoltaic modules 1000 and 4050 to be monitored without each polymer based photovoltaic module 4050 including an optical sensor 1100, thereby reducing costs. While FIG. 4 depicts a particular embodiment, in some embodiments, more than one (e.g., two, three, four, five, at least 10, at least 100) modules in the system 4000 can include a sensor, such as an optical sensor 1100.

EXAMPLE

The degradation of polycarbonate sheets induced by ultraviolet light was measured under different conditions to understand the degradation level under conditions similar to the operating conditions in the field to better define the properties of the sensor.

Figure 5:
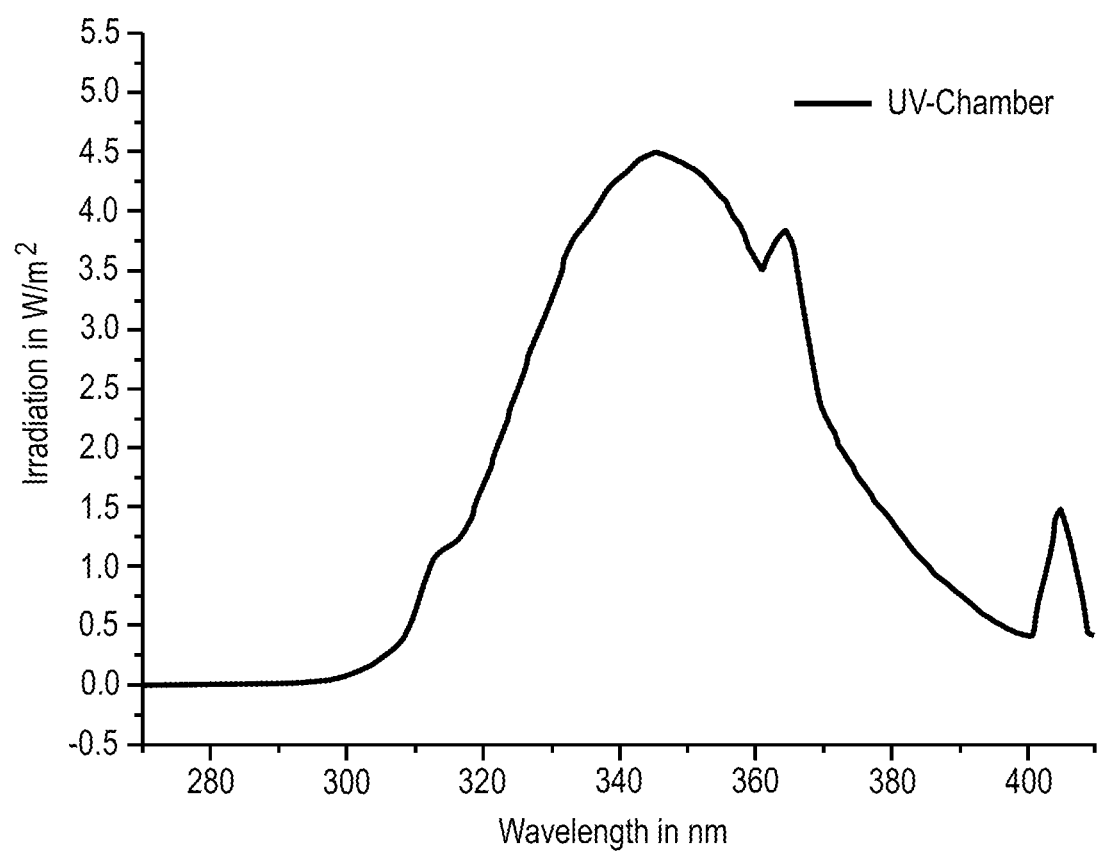
FIG. 5 depicts a graph of the spectrum of a UV light source.

Polycarbonate sheets with different protective coatings were exposed to 60 or 120 kWh/m² ultraviolet light for two weeks. FIG. 5 shows the spectrum of the UV light source used. The irradiation included UVA and UVB radiation and was 200 W/m². The chamber temperature was 60±5° C. The 120 kWh/m² exposure represented approximately two years of field exposure in sunny areas.

Figure 6B:
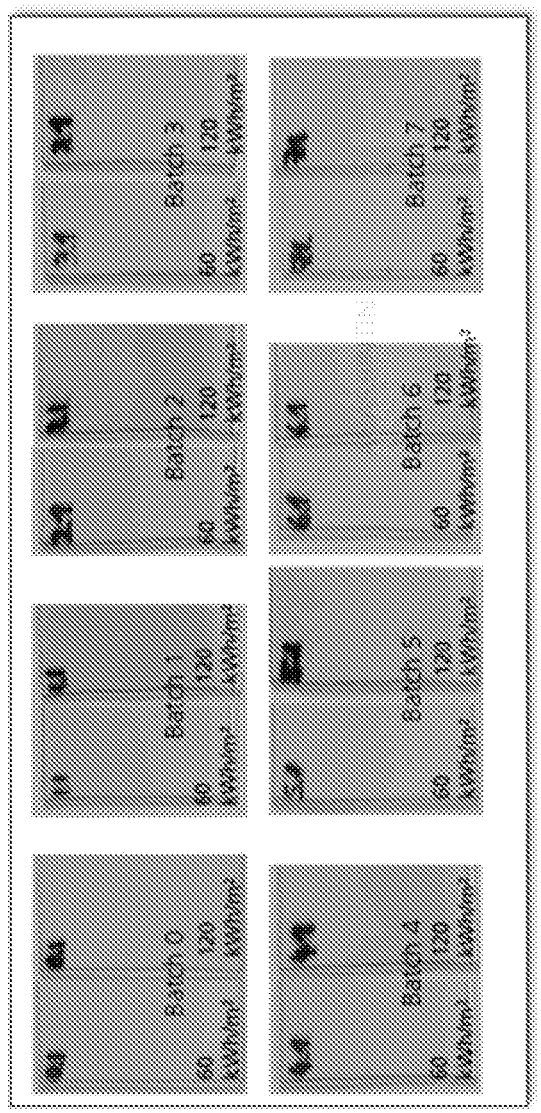
FIG. 6B depicts photographs of a series of polycarbonate sheets after exposure to 60 kWh/m$^2$ or 120 kWh/m$^2$ UV light.
Figure 6A:
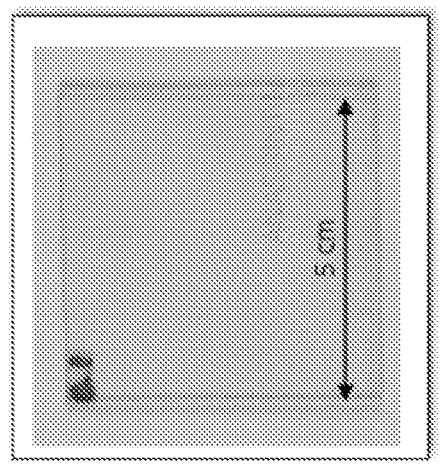
FIG. 6A depicts a photograph of a polycarbonate sheet prior to exposure to UV light.

FIG. 6A shows an uncoated polycarbonate sheet prior to UV exposure. The UV exposure was conducted in two steps of 60 kWh/m². FIG. 6B shows polycarbonate sheets after 60 kWh/m² (left) or 120 kWh/m² (right) UV light exposure. Each batch represented a different type of polycarbonate sheet in terms of coating or chemical composition. Two identical samples of each polycarbonate type were tested to monitor for statistical variations between measurements.

The transmittance of the polycarbonate sheets was measured by a Fourier-transform spectrometer Bruker Vertex 70 equipped with two integrating spheres (PTFE coated) in order to measure both the directly reflected (or transmitted) and the scattered radiation. Diffusively reflecting references, distributed and calibrated NIST (USA) and NPL (UK) were used as standards. The accuracy of these standards is 1% in the solar range. For comparative measurements a higher accuracy was assumed.

Figure 7:
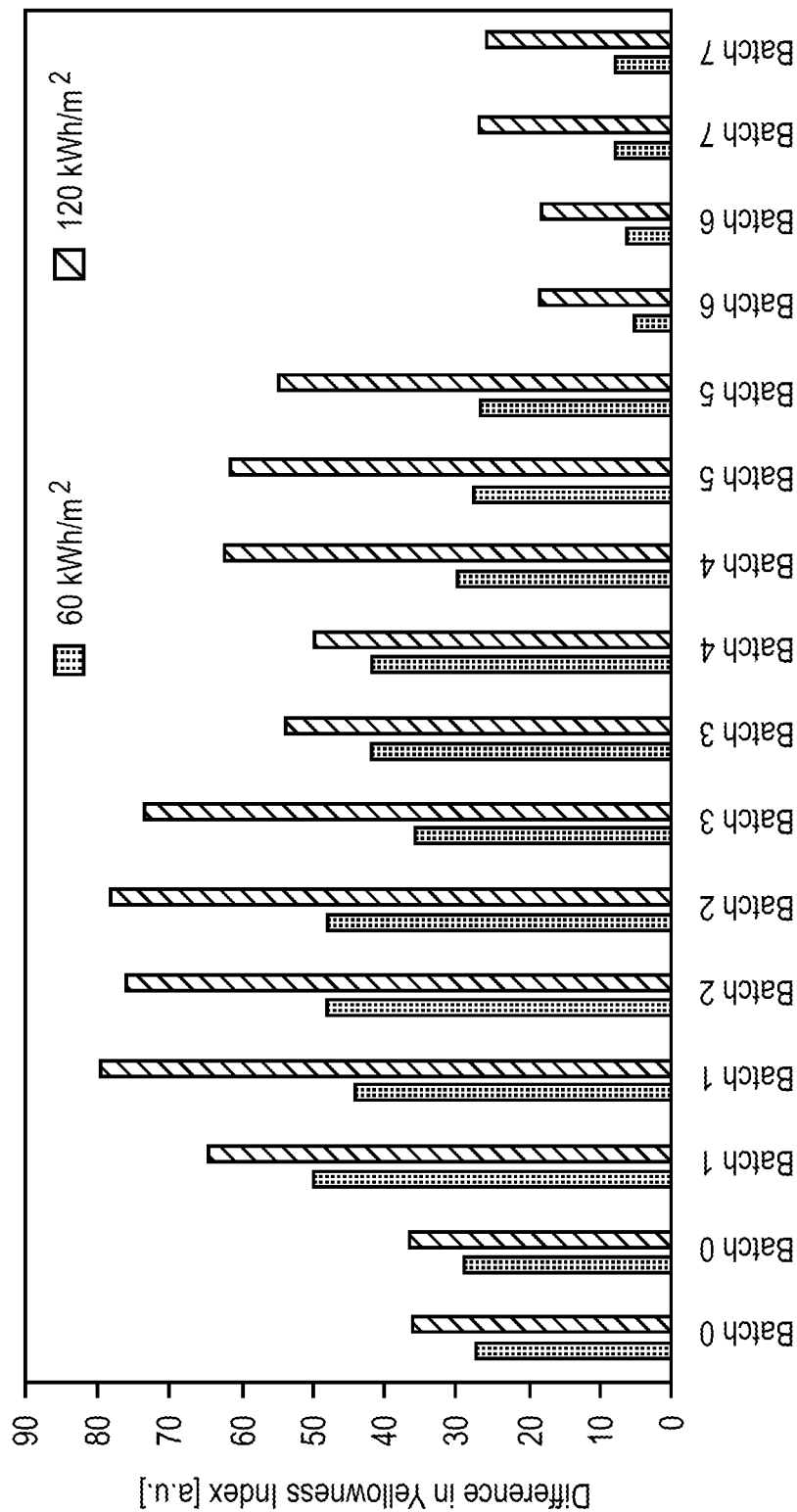
FIG. 7 depicts a bar graph of difference in yellowness index of polycarbonate sheets after exposure to 60 kWh/m$^2$ or 120 kWh/m$^2$ UV light.

FIG. 7 shows a bar graph of difference in yellowness for each of the polycarbonate sheets shown in FIG. 6B after 60 kWh/m² or 120 kWh/m² UV light exposure.

Figure 8:
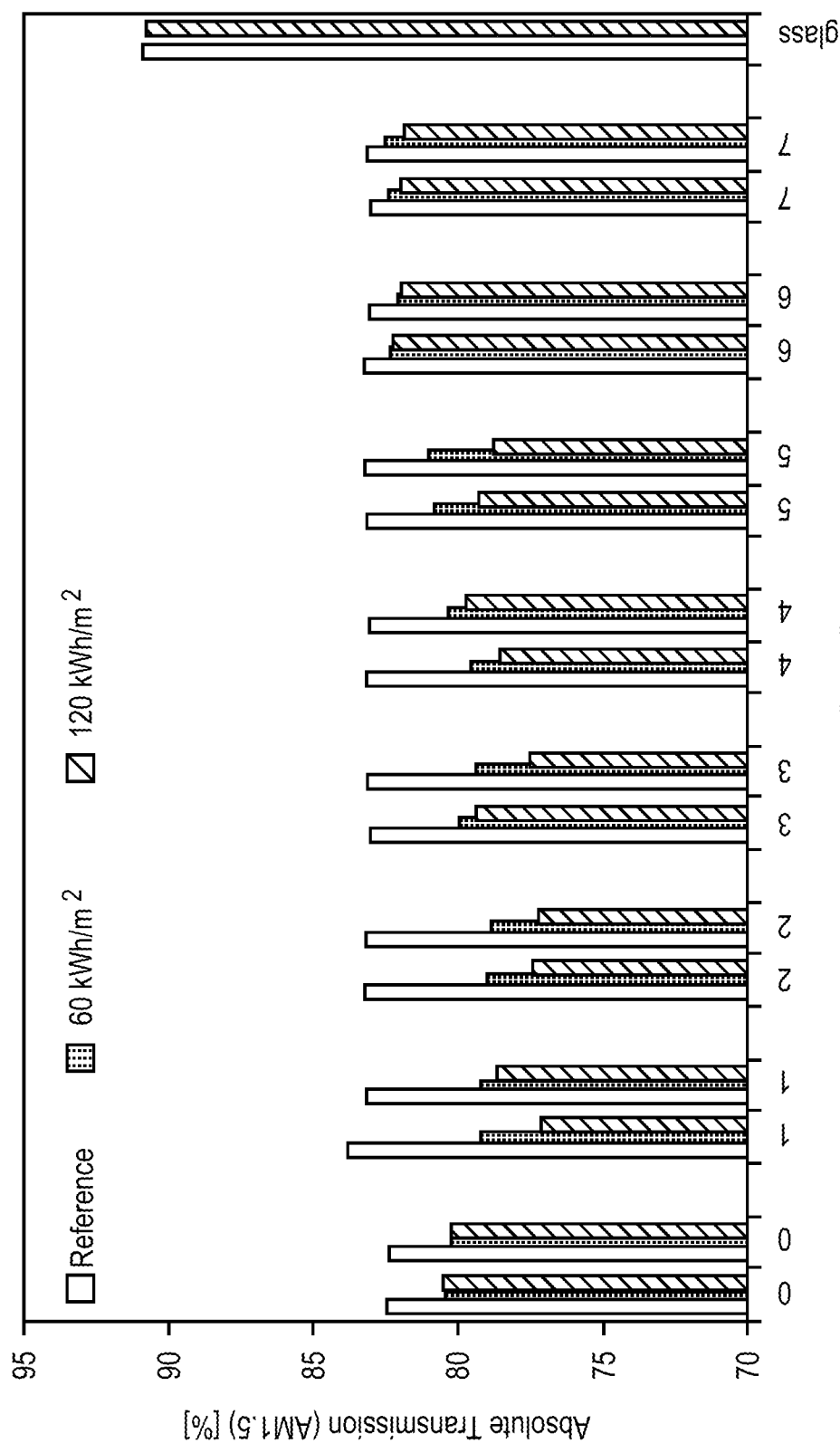
FIG. 8 depicts a bar graph of absolute transmission of polycarbonate sheets before and after exposure to 60 kWh/m$^2$ or 120 kWh/m$^2$ UV light.

FIG. 8 shows a bar graph of the absolute transmission (AM1.5) before (reference) and after 60 kWh/m² or 120 kWh/m² UV light exposure.

Figure 9:
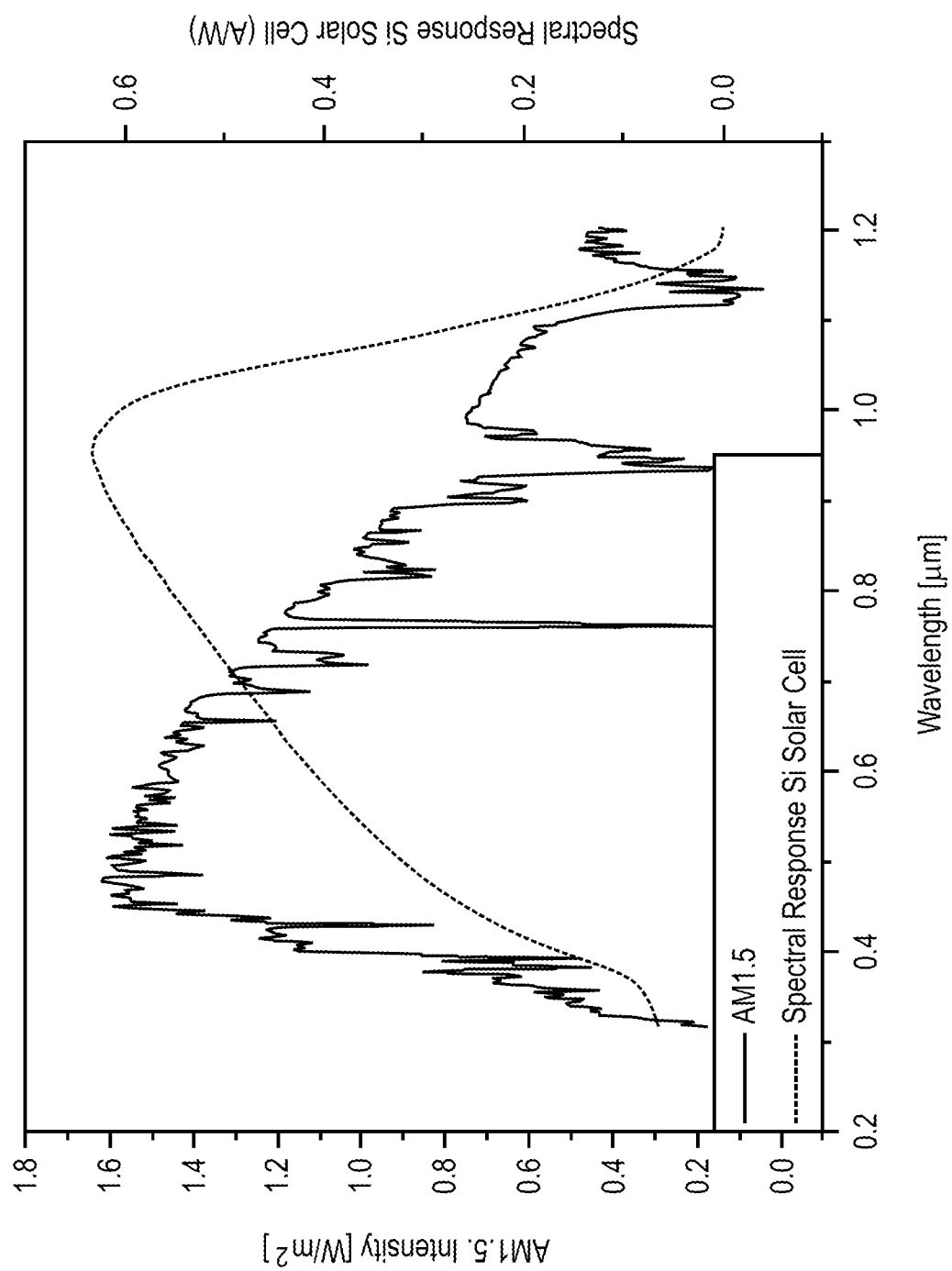
FIG. 9 depicts a graph showing the spectral response of a monocrystalline silicon solar cell and the reference AM1.5 spectrum.

Table 1 shows the change in AM1.5 transmittance and the change in current density of the polycarbonate sheets after 120 kWh/m² UV light exposure. The current density was calculated through the spectral response curve of the cell under testing, which was monocrystalline silicon. FIG. 9 shows the spectral response of a monocrystalline silicon solar cell and the reference AM1.5 spectrum.

TABLE 1 change in AM1.5 and current density after of 120 kWh/m² UV light exposure

| Batch | Change in AM1.5 transmittance [%] | Change in current density [%] |
| --- | --- | --- |
| 0 | −2.46 | −1.44 |
| 1 | −6.71 | −4.89 |
| 2 | −7.06 | −5.09 |
| 3 | −5.61 | −4.00 |
| 4 | −4.72 | −3.29 |
| 5 | −5.02 | −3.48 |
| 6 | −1.24 | −0.82 |

The results show polycarbonate can degrade under continuous UV/heat exposure similar to real operating conditions demonstrating the desirability of monitoring degradation in the field.

OTHER EMBODIMENTS

While certain embodiments have been disclosed above, the disclosure is not limited to such embodiments.

As an example, in some embodiments, polymer degradation can be measured by integrating on top of the polymer based photovoltaic module 1000 a reference light sensor (e.g., silicon photodiode) encapsulated in glass or another UV and weather resistant material. The outputs of the reference sensor and the optical sensor 1100 can be referenced during the initial fabrication of the polymer based photovoltaic module 1000 and the ratio of their transmittance can be logged during operation to track polymer optical degradation. The logged outputs can be the short circuit current of each sensor, which is directly related to the optical transmittance of the polymer.

What is claimed:
1. A method, comprising:
exposing a photovoltaic module comprising a first polymer layer between second and third polymer layers to ultraviolet light;
measuring a transmittance of light in the first polymer layer using a first optical sensor disposed in the first polymer layer at a first position; and
calculating a change in transmittance relative to a transmittance of the first polymer layer prior to ultraviolet light exposure.
2. The method of claim 1, further comprising, after measuring the transmittance of light in the first polymer layer:

wirelessly transmitting data to a data acquisition system,
wherein the data comprises information about the transmittance of light in the first polymer layer measured using the first optical sensor.

3. The method of claim 1, further comprising, after measuring the transmittance of light in the first polymer layer, calculating a yellowing index.

4. The method of claim 1, further comprising supplying power to the first optical sensor using the photovoltaic module.

5. The method of claim 1, further comprising:
measuring the transmittance of light in the first polymer layer using a second optical sensor disposed in the first polymer layer at a second position,
wherein the second position is different from the first position.

6. The method of claim 1, further comprising:
measuring a moisture level in the photovoltaic module using a moisture sensor disposed in the first polymer layer.

7. The method of claim 1, further comprising:
measuring a moisture level in the photovoltaic module using a temperature sensor disposed in the second polymer layer.

* * * * *